United States Patent
Sriram et al.

(10) Patent No.: US 11,100,271 B2
(45) Date of Patent: Aug. 24, 2021

(54) SEAMLESS TRANSITION BETWEEN ROUTING MODES

(71) Applicant: Synopsys, Inc., Mountain View, CA (US)

(72) Inventors: Mysore Sriram, Bangalore (IN);
Praveeen Yadav, Bangalore (IN);
Philippe Aubert McComber, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/026,114

(22) Filed: Sep. 18, 2020

(65) Prior Publication Data

US 2021/0089699 A1   Mar. 25, 2021

(30) Foreign Application Priority Data

Sep. 20, 2019   (IN) .............................. 201911037923

(51) Int. Cl.
| | |
|---|---|
| *G06F 30/394* | (2020.01) |
| *G06F 30/31* | (2020.01) |
| *G06F 30/392* | (2020.01) |
| *G06F 3/0481* | (2013.01) |

(52) U.S. Cl.
CPC ........ *G06F 30/394* (2020.01); *G06F 3/04812* (2013.01); *G06F 30/31* (2020.01); *G06F 30/392* (2020.01)

(58) Field of Classification Search
CPC .................................................... G06F 30/394
USPC ......................................................... 716/126
See application file for complete search history.

(56) References Cited

U.S. PATENT DOCUMENTS

| | | | |
|---|---|---|---|
| 8,924,913 B1 * | 12/2014 | Goh ........................ | G06F 30/30 716/139 |
| 10,867,105 B2 | 12/2020 | Sriram et al. | |
| 2011/0029944 A1 * | 2/2011 | Giffel ..................... | G06F 30/394 716/126 |
| 2013/0125078 A1 * | 5/2013 | Bosshart ................ | G06F 30/394 716/126 |
| 2013/0263073 A1 * | 10/2013 | Gentry .................. | G06F 30/394 716/112 |
| 2017/0249413 A1 * | 8/2017 | McComber ......... | G06F 3/04842 |

* cited by examiner

*Primary Examiner* — Eric D Lee

(74) *Attorney, Agent, or Firm* — Patterson + Sheridan, LLP

(57) ABSTRACT

Seamless transitions between routing modes are provided via providing a cursor in association with a design layout; in response to receiving a follow-the-cursor (FTC) command at a first position in the design layout, create a first trace in the design layout where the cursor is displayed; in response to receiving a start command for point-to-point routing at a second position in the design layout: complete the first trace at the second position; and provide an indicator at the second position; in response to receiving an end command for point-to-point routing at a third position in the design layout: create a second trace in the design layout where the cursor is displayed; and create a third trace in the design layout, wherein the third trace is routed from the first trace to the second trace.

20 Claims, 12 Drawing Sheets

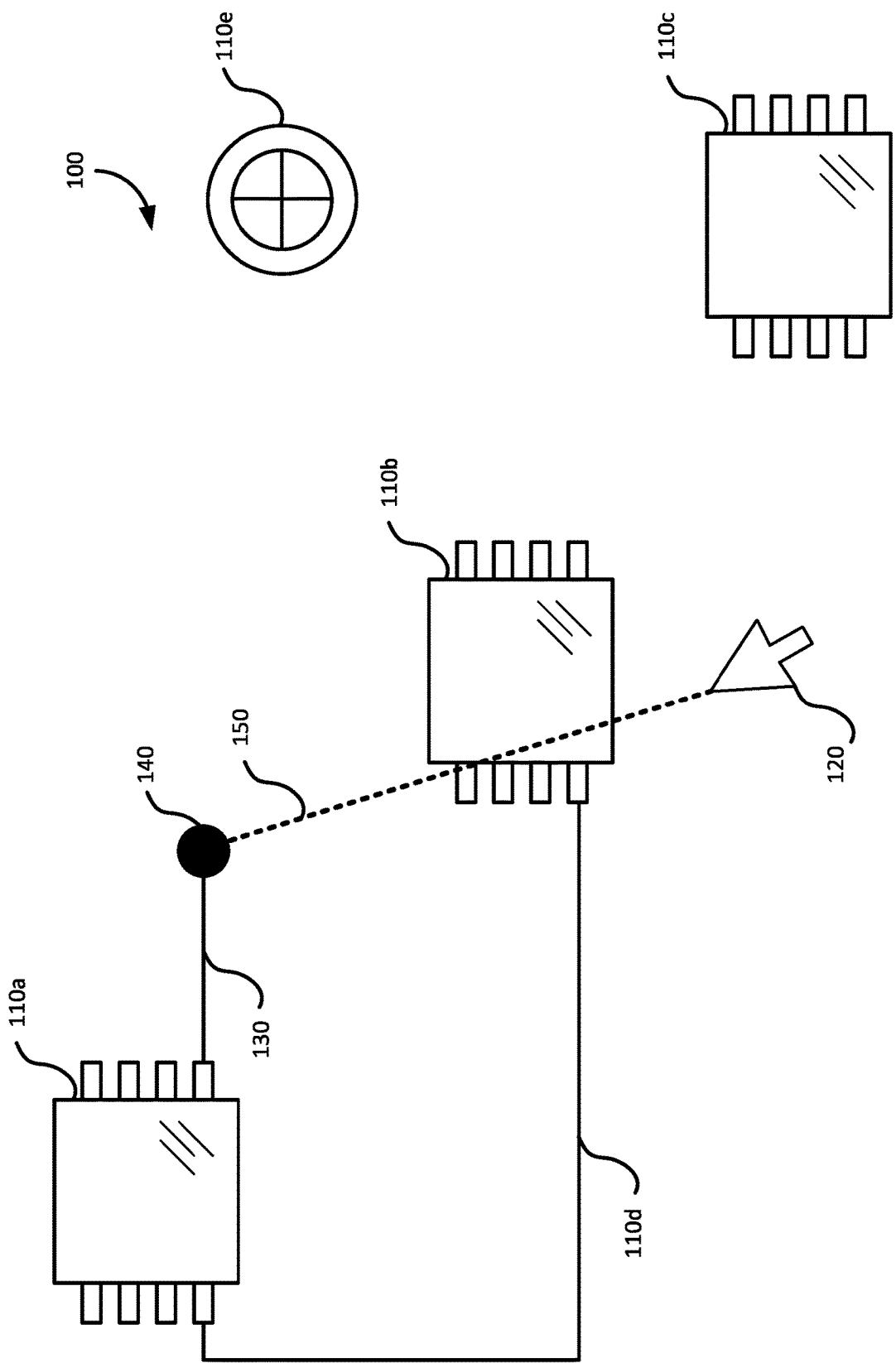

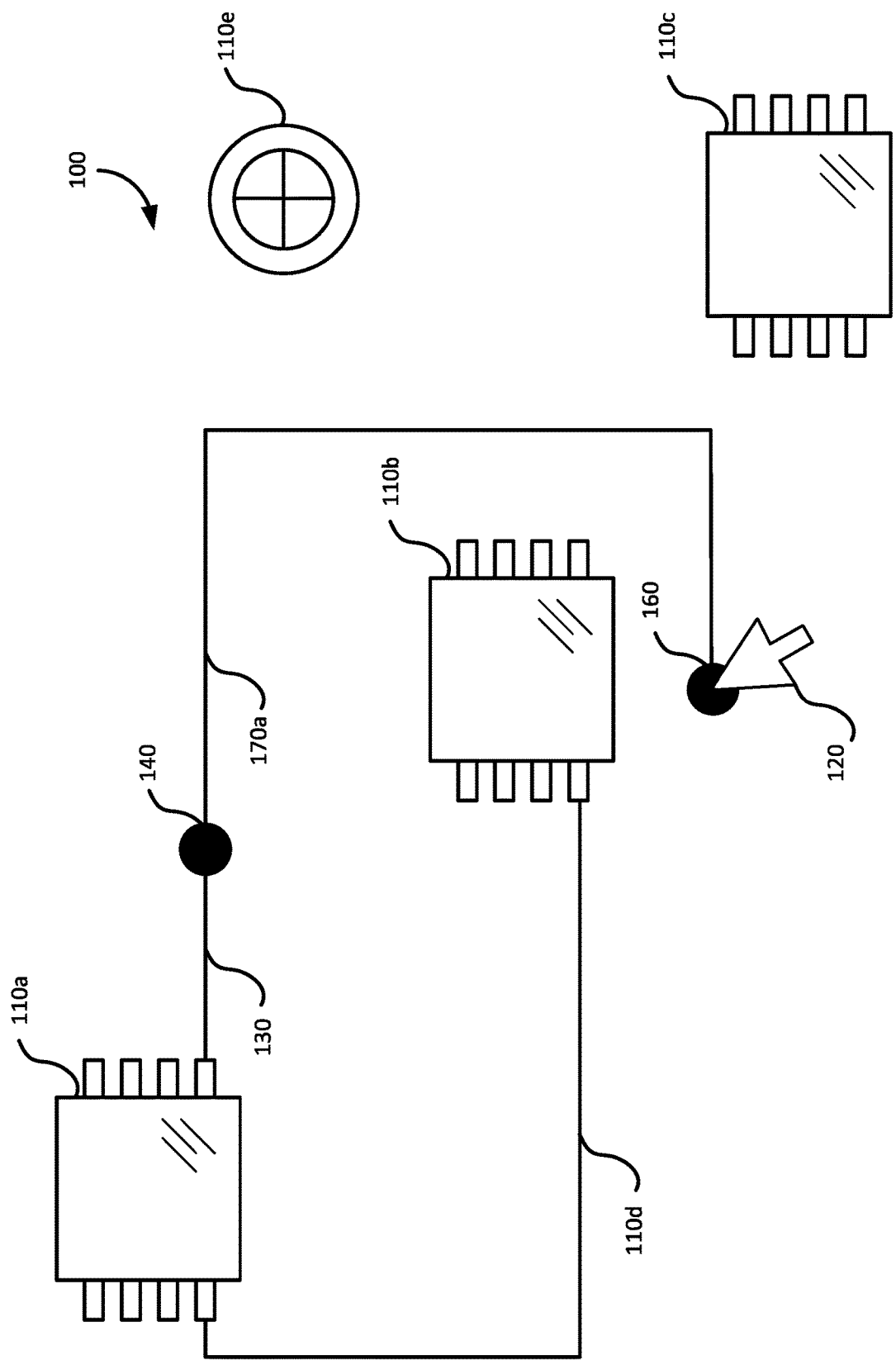

SEAMLESS TRANSITION BETWEEN ROUTING MODES

CROSS-REFERENCES TO RELATED APPLICATIONS

The present disclosure claims priority to India Provisional Patent Application IN201911037923 filed Sep. 20, 2019, entitled "SEAMLESS TRANSITION BETWEEN FOLLOW-THE-CURSOR AND POINT-TO-POINT INTERACTIVE ROUTING", which is incorporated herein by reference in its entirety.

TECHNICAL FIELD

The present disclosure relates to the user interfaces in general, including an interface that allows a user to switch seamlessly between two traditionally distinct trace routing modes in an interface for designing a layout for an electrical circuit.

BACKGROUND

Custom routing is increasingly the most time-consuming and effort-intensive step in the chip design flow, because the designer must precisely control route shapes to achieve desired electrical characteristics of the circuit. At the same time, the increases in circuit design complexity makes it highly desirable to increase productivity by using automation to automatically route traces in the circuit design. Accordingly, some custom routers offer two separate "modes" of operation in which the first is a "follow-the-cursor" (FTC) mode, where the user draws the desired route interactively using a cursor (e.g., controlled by a mouse), and the second is a "point-to-point" (P2P) mode, where the user signals an auto-router program to complete a route between two specified pins. Some interactive FTC routers provide an "auto-complete" ability, where the user can invoke the auto-router to complete a partially drawn route, by finding a path from the current mouse location to the nearest pin.

However, the auto-complete feature is often not sufficiently flexible for many practical situations, where the designer may want to carefully control the route topology for some part of the route and rely on P2P auto-routing for other parts. For example, the designer may want to manually plan the "tail" sections near pins in congested regions, and leave the rest of the route to an auto-router. The only way to achieve this using existing tools is to draw the tails using the interactive router, then switch to the auto-router to route between the tails. This two-step approach is cumbersome and likely to lead to unproductive iterations to get the desired solution

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 1A-1H illustrate one example sequence of mode-switching trace routing in a design layout, according to embodiments of the present disclosure.

DETAILED DESCRIPTION

Figure 1A:
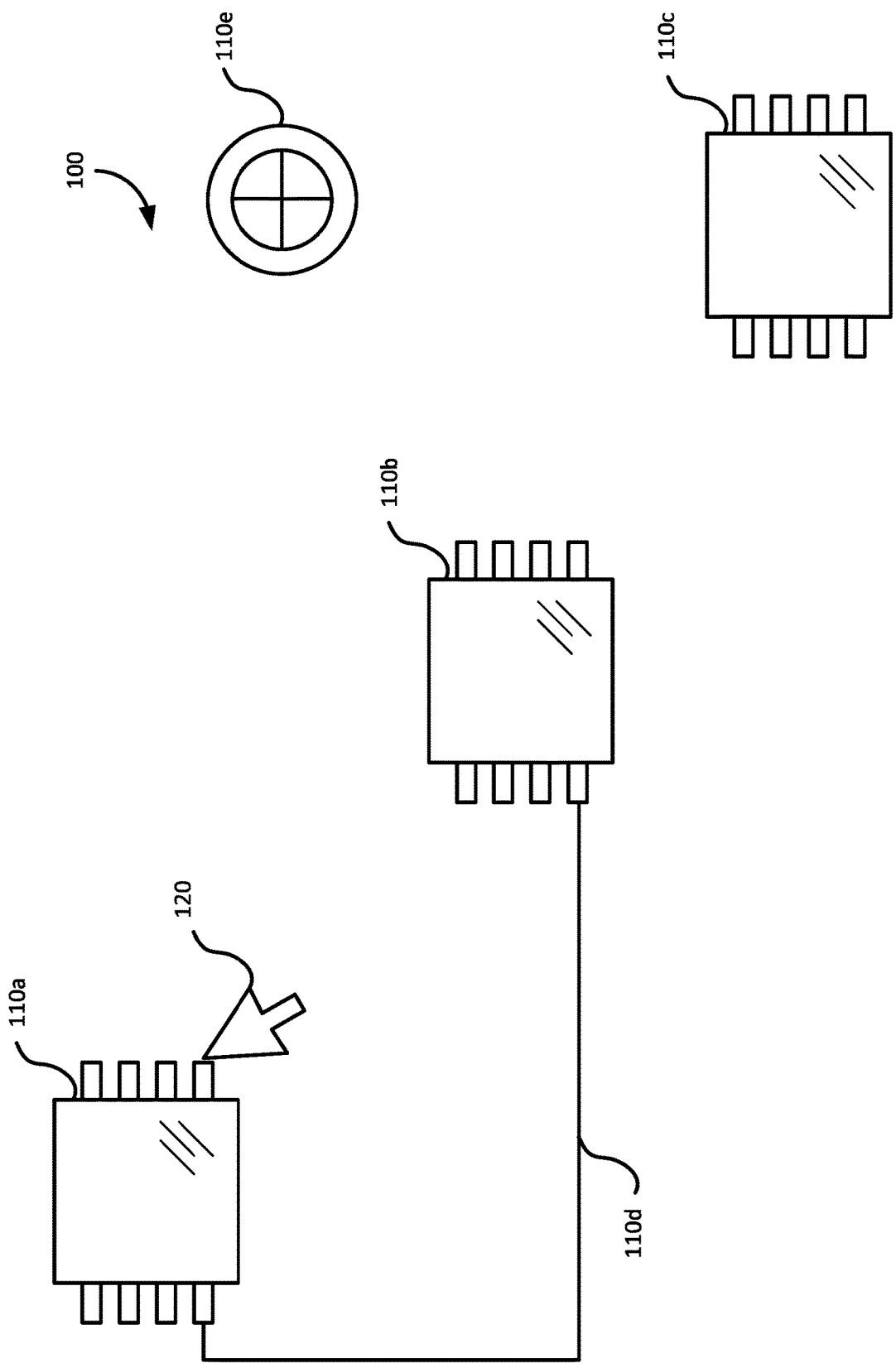

Embodiments of the present disclosure relate to integrating an auto-router with an interactive manual router to provide a user with the ability to seamlessly switch back and forth between the routing modes. There is no limit to the number of times that the user can switch between the two modes while implementing a trace route (e.g., an electrically conductive pathway in a circuit design). The flexibility offered by the present disclosure thus improves the functionality of the design software by making the user experience faster and more precise in a variety of scenarios.

In one example, when user manually controls where the main trunk of a trace is routed, the auto-routing feature is used to create "tail" connections from the trunk to the end points (e.g., various pins for various cells). In another example, the user manually controls those portions of the trace route that are close to the pins (e.g., to avoid blocking nearby pins in a congested region), and the auto-routing feature is used to create the main trunk further from the pins. In a further example, the user manually controls the trace route in regions of the design with low-congestion, and the auto-routing feature finds a path for the trace route through a high-congestion region, after which the user resumes manual control in a second low-congestion region. In yet another example, the user imparts high level manual control by specifying various "waypoints" at specific positions in the design layout, but allows the auto-routing feature to identify a path for the trace to traverse the regions between the waypoints to automatically create the trace route connecting the waypoints.

Because the FTC mode follows the user's cursor to define the path that the trace route is created on, changes in position of the cursor in the design layout result in changes to the route. The present disclosure provides for the seamless transition into and out of FTC mode without the user having to move the cursor from a current position in the design layout, allowing the user to start routing at the same point when changing modes. For example, instead of using a software-defined control (e.g., such as a button in a ribbon or drop down menu) selected by the cursor, the user signals a transition in modes via a hardware defined input code such as, for example, a keyboard shortcut (e.g., ctrl-j, shift-ctrl-m), voice command, tablet button push, or mouse button combination (e.g., holding mouse-4 and mouse-1, double clicking mouse-3) reserved as a hardware defined input code to signal a routing mode switch in the application used for displaying and modifying the design layout.

FIGS. 1A-1H illustrate one example sequence of mode-switching trace routing in a design layout 100, according to embodiments of the present disclosure. As will be appreciated, the present disclosure can be applied in a variety of scenarios to improve the user experience (UX) and functionality of the design layout software of program, and the example shown in FIGS. 1A-1H are not limiting. FIGS. 1A-1H generally illustrate a single layer of the design layout 100 (e.g., in the XY plane), but the design layout 100 can include more than one layer (e.g., allowing for routing in different, parallel XY planes as different layers) that includes various elements not shown in FIGS. 1A-1H.

FIG. 1A illustrates a first state of the design layout 100 showing several circuit elements 110a-e (generally, circuit elements 110) that are pre-existing or pre-placed before the user begins routing a trace through the design layout 100. In various embodiments, the circuit elements 110 can be various electrical or non-electrical components or features included in the design layout that prevent or block a user from routing the trace through the region occupied by that circuit element 110. For example, a first circuit element 110a, a second circuit element 110b, a third circuit element 110c are each a cell or logic gate block with several input/output pins. An example fourth circuit element 110d is shown as a previously routed trace between a pin of the first circuit element 110a and a pin of the second circuit element 110b. An example fifth circuit element 110e is a physical feature (e.g., a through-hole defined in a circuit board, an assembly marker, a space reserved for a label or for physical handling) that otherwise prevents routing a trace through the area occupied thereby.

The user can manipulate the placement of the various circuit elements 110, add additional circuit elements 110, remove circuit elements 110, etc., via various controls in a software application providing the design layout 100. In various embodiments, the software application provides a cursor 120 in association with the underlying design layout 100 to indicate where the user has focus, and where the user's actions will take effect in the design layout 100. In FIG. 1A, the user has located the cursor 120 on a pin of the first circuit element 110a, and has selected to begin tracing a new path trace in FTC mode though the design layout 100.

Figure 1B:
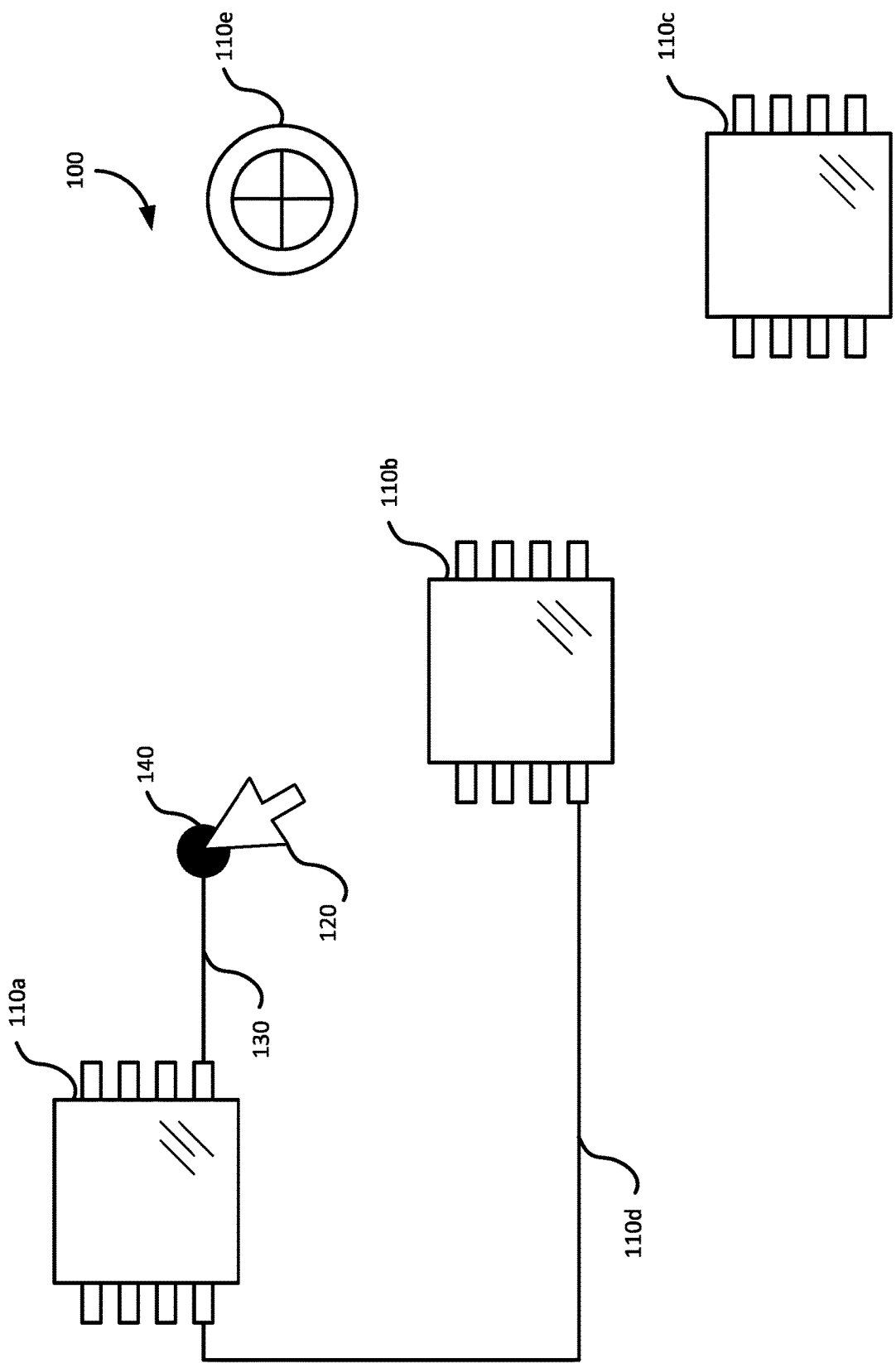

FIG. 1B illustrates a second state of the design layout 100, where the user, in FTC mode, has created a first trace 130 connected to first position associated with the pin of the first circuit element 110a to the current location of the cursor 120 at a second position 140 in the design layout 100. In FTC mode, the software application generally creates or extends a trace in the design layout 100 that mimics where the user has re-located the cursor 120. In various embodiments, the user can use various input hardware coupled to the cursor 120 (via an operating system) including track pads, mice, joysticks, touch-screens, track balls, keyboard arrows, and combinations thereof.

Although illustrated in association with a circular indicator, the second position 140 can be identified by various shapes, sizes, and colors of indicators or without an indicator, such as, for example, via the leading edge of a newly created trace or the point of a cursor 120.

FIG. 1C illustrates a third state of the design layout 100, where the user has entered P2P mode at the second position 140 and has moved the cursor 120 away from the second position 140. The software application follows the cursor 120 and visually links the current location of the cursor 120 to the second position 140 via a fly-line 150. The fly-line 150 is a user interface feature that overlays the display of any underlying circuit elements 110 (e.g., the second circuit element 110b) to visually convey to the user where the routing module left FTC mode and entered P2P mode. In various embodiments, the fly-line 150 can be displayed in various colors, with various animation effects, and various thicknesses to visually distinguish the fly-line 150 from the visuals of the traces and other elements shown in the design layout 100.

Figure 1D:
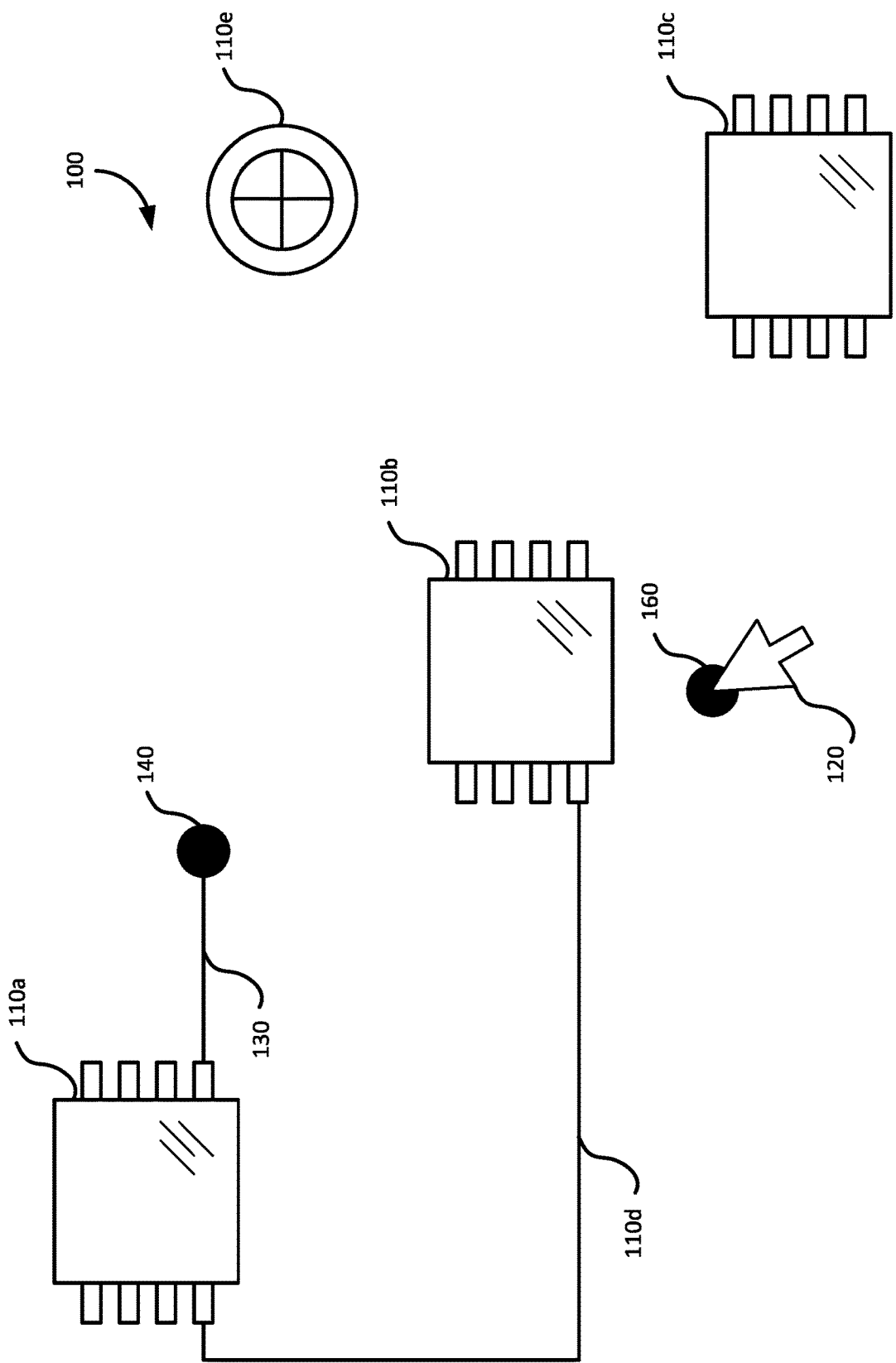

FIG. 1D illustrates a fourth state of the design layout 100, where the user has selected a third position 160 in the design layout 100 to exit P2P mode and reenter FTC mode. In various embodiments, the fourth state can be displayed to the user while an auto-routing module of the software application calculates a path for the trace between the second position 140 (e.g., a jump start point) and the third position 160 (e.g., a jump end point).

Although illustrated in association with a circular indicator, the third position 160 can be identified by various shapes, sizes, and colors of indicators or without an indicator, such as, for example, via the point of a cursor 120.

In various embodiments the auto-routing module identifies one or more paths based on user-adjustable parameters to identify a path that best satisfies those parameters within a given search/analysis time frame. For example, the parameters can specify that the auto-router is to prefer paths that traverse fewer layers compared to paths that traverse more layers, to prefer shorter paths over longer paths, to prefer paths that run parallel to other paths, avoid regions with a threshold distance of an existing circuit element, etc., among other path characteristics. The parameters define various weights for determining whether the characteristics of a given trace route define an "optimal" path between the start and end point, and the user define or select from various sets of parameters to specify what features are preferred in a trace route (e.g., shorter overall length, fewer layers traversed, etc.). In various embodiments, the auto-router can present more than one option to the user based on different parameter sets for how to automatically route the trace, or the user can reject a presented option to receive a "next best" or a different trace using a different set of parameters.

FIG. 1E illustrates a first option for a fifth state of the design layout 100, such as one of the paths identified by the auto-router as a "best" path based on the routing parameter. As shown, a first option for the second trace 170a connects to the first trace 130 at the second position 140 and extends around the second circuit element 110b to route to the third position 160. The user, however, may identify that future traces between the second circuit element 110b and the third circuit element 110c and reject the first option for the second trace 170a to receive a second (or subsequent) option for the second trace 170b, such as is shown in FIGS. 1F and 1G.

Figure 1F:
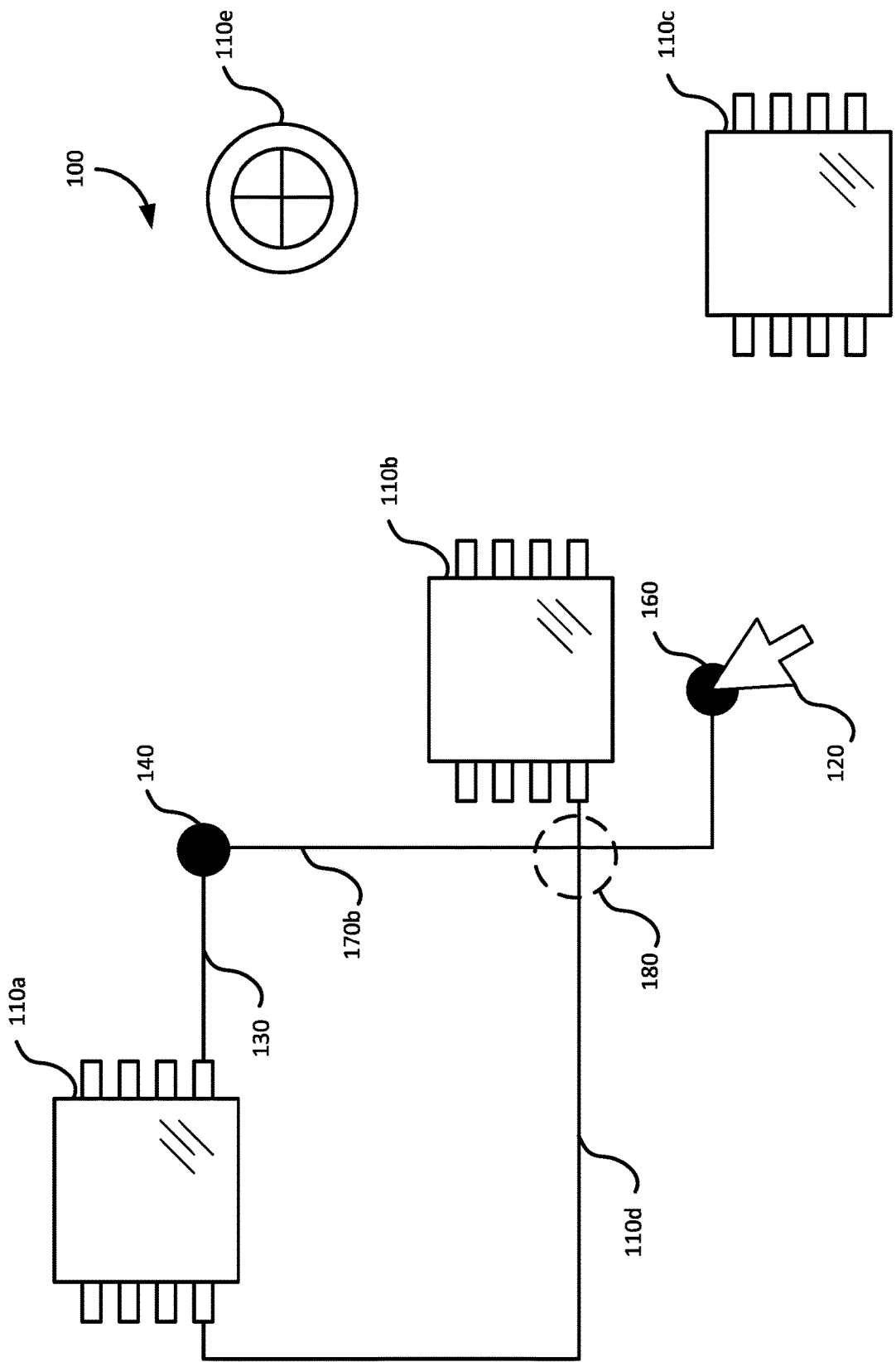

FIG. 1F illustrates a sub-step of a second option for the fifth state of the design layout 100 that identifies an intersection 180 between the second option for the second trace 170b and an existing circuit element 110 (e.g., the pre-existing trace of the fourth circuit element 110d). To resolve the intersection 180, the auto-routing module can force a portion of one of the elements to traverse more than one layer in the design layout 100. For example, as is shown in FIG. 1G, a portion 175 of the second trace 170b is re-routed to a different layer above or below the current layer to route the second trace 170d around the fourth circuit element 110d. Although not illustrated, in some embodiments, the auto-routing module can shift a portion of a pre-existing circuit element 110 to a different layer to allow the second trace 170d to remain defined in a single layer.

Figure 1G:
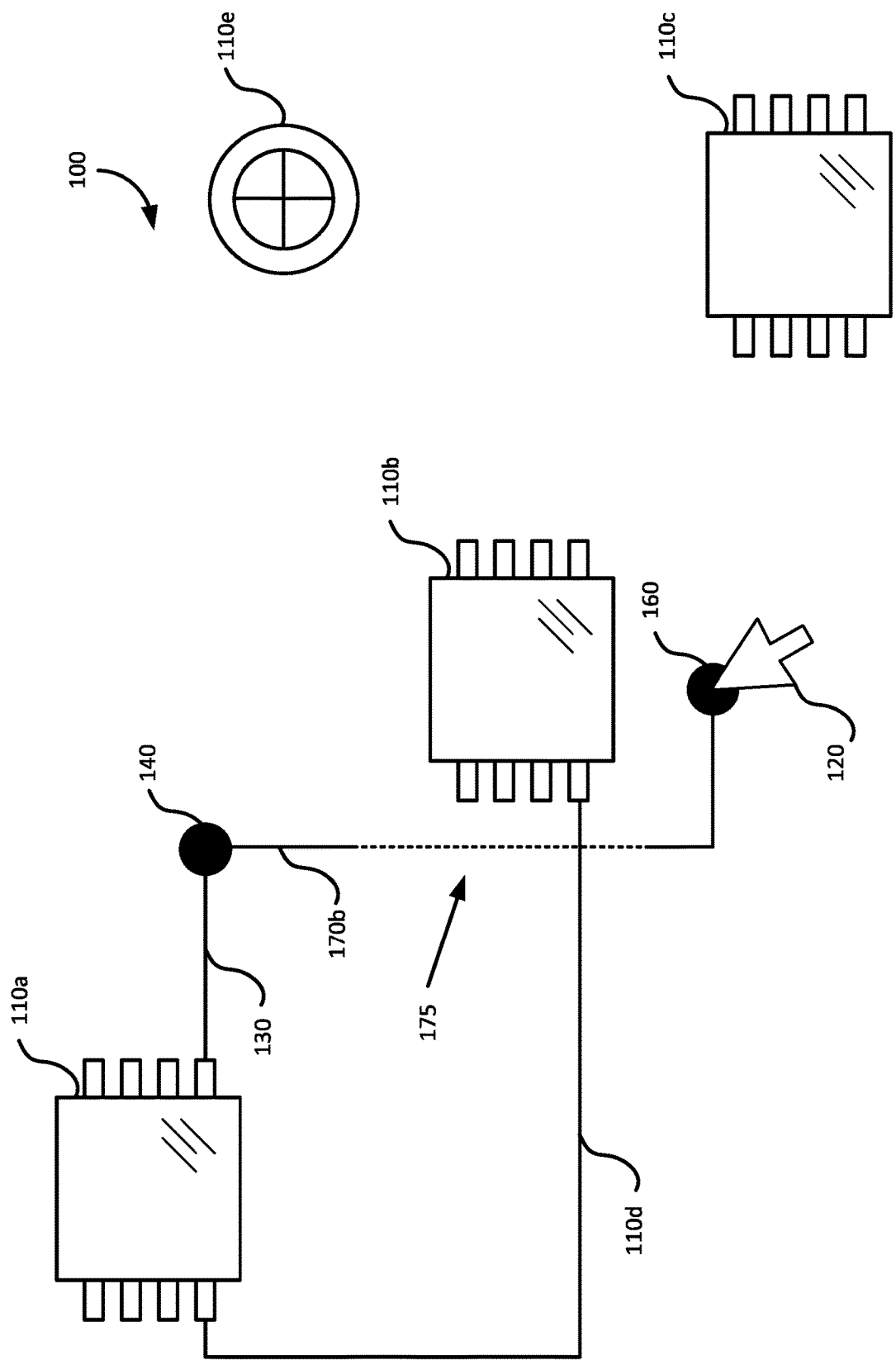
Figure 1H:
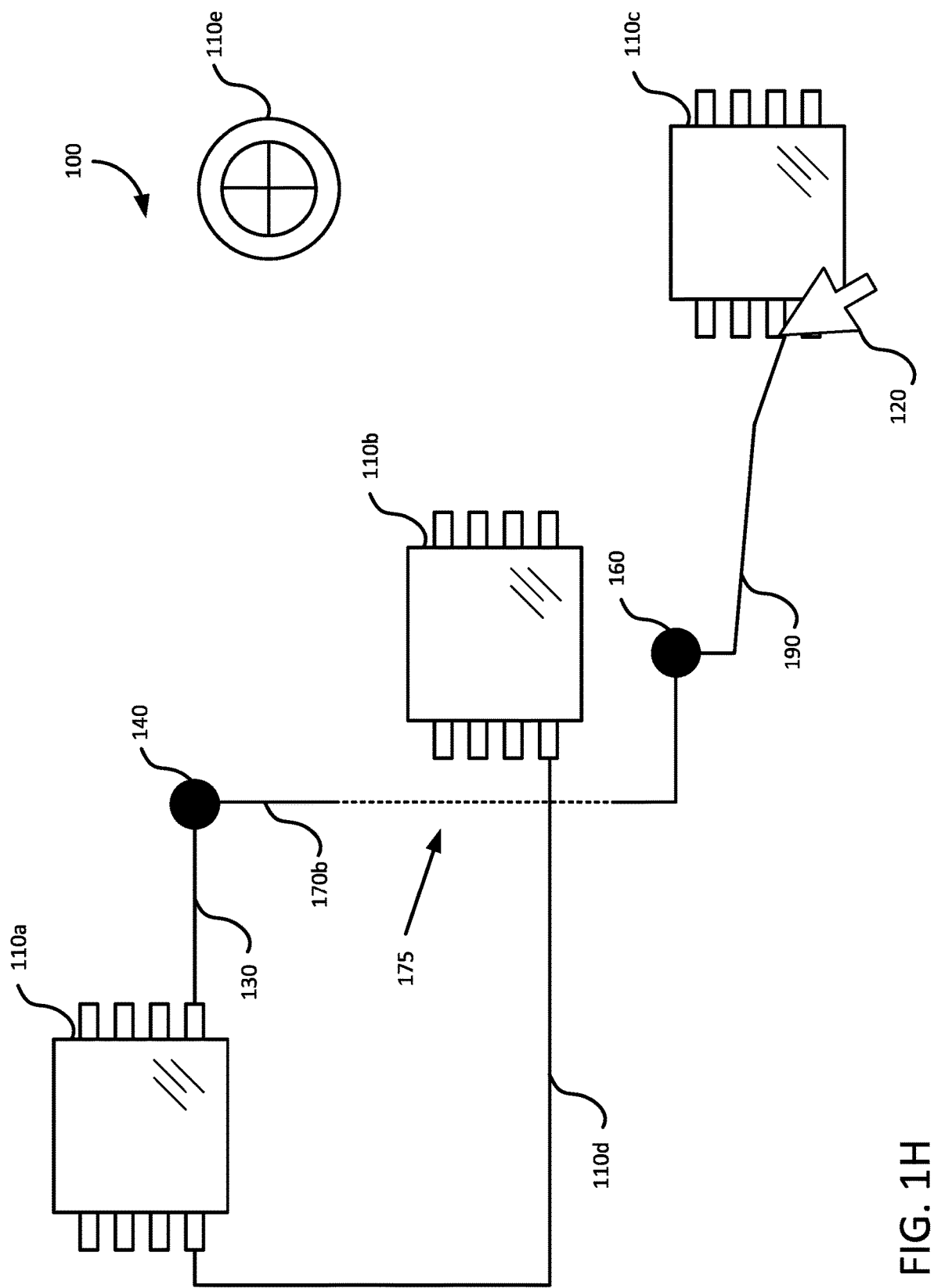

FIG. 1H illustrates a sixth state of the design layout 100, based on the second option for the fifth sate shown in FIG. 1G. When returning to FTC mode from P2P mode, the user can again move the cursor 120 to define a trace in the design layout 100. As shown, the user has created a third trace 190 connected to third position 160 where the user exited P2P mode and is drawn to a pin of the third circuit element 130c. In various embodiments, the user can manually exit FTC mode (e.g., via keystroke sequence, lifting a mouse button, etc.) or the software applicant can automatically exit FTC mode when the user connects a trace to an existing trace, a pin of a circuit element 110, or the like.

As shown, the path set out by the cursor 120 (and followed by the trace) may be uneven or composed of non-straight line segments. In various embodiments, the manually specified trace routes are adjusted by the software application to straighten lines, adjust angles of turn between straight segments, or automatically jump to components (e.g., to fill in gaps within a distance threshold).

Figure 2:
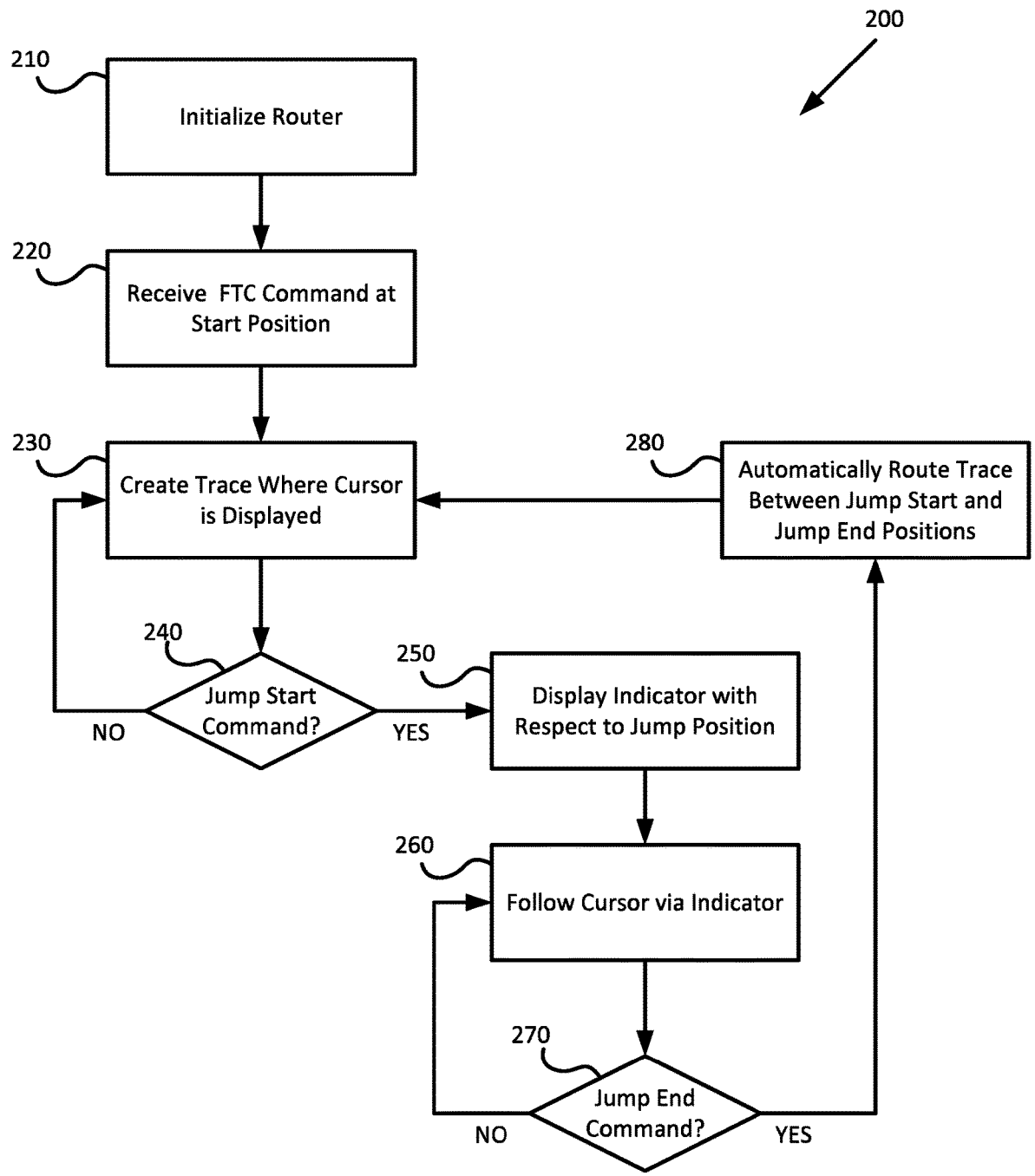
FIG. 2 is a flowchart of a method for seamless transition between routing modes, according to embodiments of the present disclosure.

FIG. 2 is a flowchart of a method 200 for seamless transition between routing modes, according to embodiments of the present disclosure. Method 200 begins at block 210, where a user initializes a routing function within a circuit design and layout software application to define where a trace route is to be created. In various embodiments, the user can specify various parameters for the trace route (e.g., wire/trace thickness, auto-routing parameters, etc.).

At block 220, the routing function receives an FTC command at a start position in the layout. In various embodiments, the FTC command can be received at a position associated with an existing circuit element (e.g., a trace, a logic block pin) or in a free space not associated with any existing circuit elements. The start position corresponds to the current position of a cursor or other pointer in relation to the design layout displayed in the software application.

At block 230, the routing function creates a trace where the cursor is displayed. The routing function continues to create the trace where the cursor is displayed as the user moves the cursor about relative to the displayed design layout. In various embodiments, the user can navigate the cursor between layers of the design layout, and the routing function continues to create the trace by forming a via or inter-layer trace to link the trace between intervening layers. The routing function continues to create the trace based on the location of the cursor until a jump start command is received at block 240.

In response to receiving a jump start command at block 240, method 200 proceeds to block 250, where the routing function displays an indicator with respect to the jump start position. The jump start position corresponds to the position in the design layout where the cursor was located when the jump start command was received. In various embodiments, the jump start command is a keyboard shortcut, voice command, tablet button push, or mouse button combination that allows the cursor to remain stationary when switching routing modes.

At block 260, the routing function follows the cursor via the indicator, which is a fly-line in some embodiments, but does not create a trace route in the design layout until a jump end command is received at block 270. In various embodiments, the jump end command is the same command as the jump start command, but may be a different keyboard shortcut, voice command, tablet button push, or mouse button combination from the jump start command that also allows the cursor to remain stationary when switching routing modes.

In response to receiving the jump end command at block 270, method 200 proceeds to block 280, where the routing function automatically routes a trace between the jump start point and the jump end point. The jump end position corresponds to the position in the design layout where the cursor was located when the jump end command was received. In various embodiments, the routing function provides one or more candidate automatic routing solutions to the user to select between before returning to block 230 to continue routing in FTC mode by creating a trace where the cursor is displayed. For example, a user can select between a first automatic routing solution to connect the jump start point with the jump end point that traverses multiple layers of the design with a total run distance of X mm, and a second automatic routing solution that remains on a single layer, but has a total run distance of 3X mm. A user can select between several automatic routing solutions based on different sets of routing parameters that specify different ways for the automatic router to identify an "optimal" or "best" route according to those parameters. In various embodiments, the user can cycle through the different routes (e.g., via a mouse wheel) that are prepared by the auto-router for review by the user, or the user can reject a proposed route to cause the auto-router to produce a new automatically generated route for subsequent approval or rejection by the user.

Method 200 may continue until an exit command is received from the user, manually exiting trace route placement, or the routing function detects an end-of-route condition (e.g., a route defining a trace between the pins two circuit elements, a route attempting to traverse a prohibited path, the software application losing focus to a different application, etc.), and the routing function automatically exits trace route placement.

Figure 3:
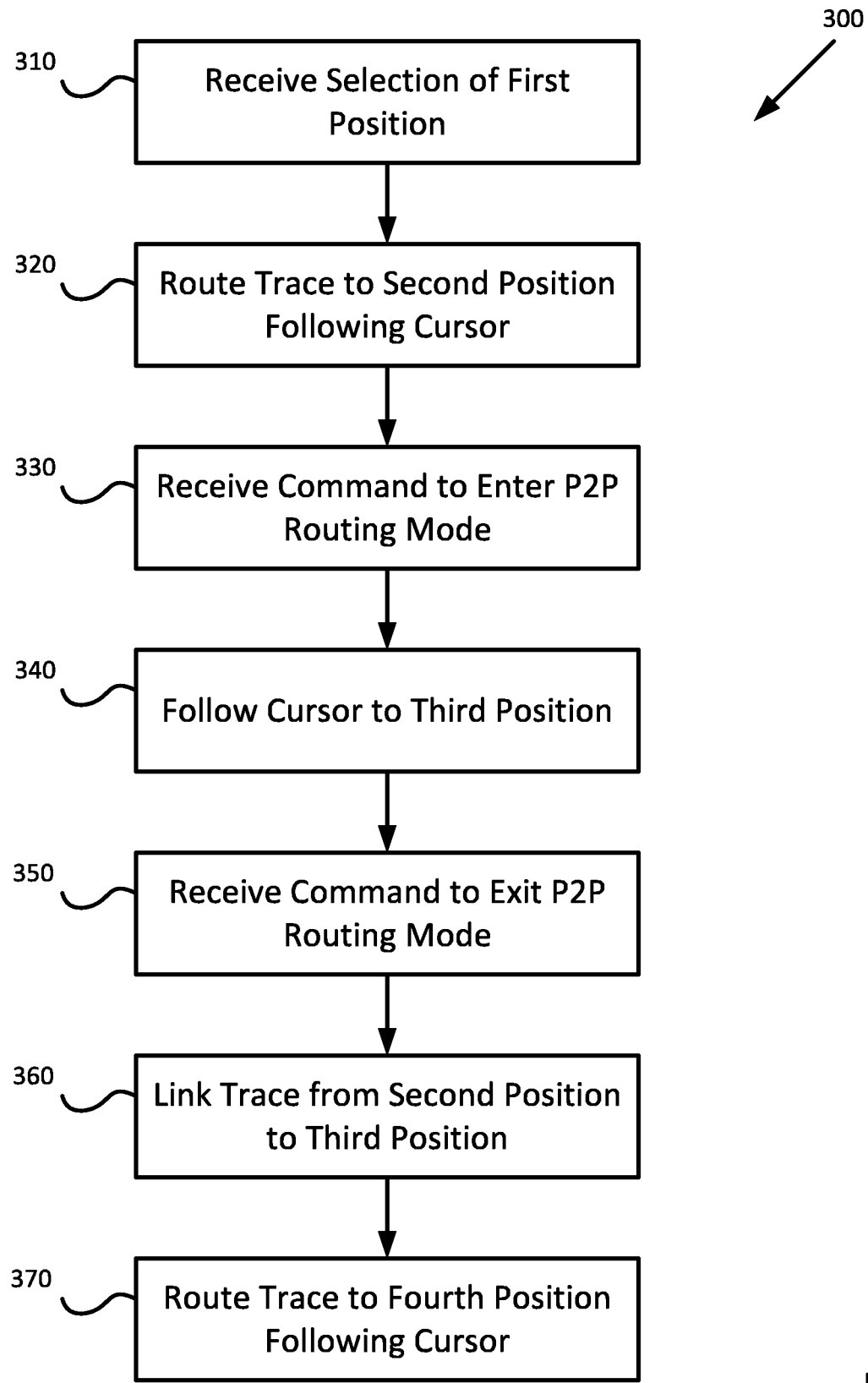
FIG. 3 is a flowchart of a method for seamless transition between routing modes, according to embodiments of the present disclosure.

FIG. 3 is a flowchart of a method 300 for seamless transition between routing modes, according to embodiments of the present disclosure. Method 300 begins at block 310 where a trace function receives a selection of a first position in a design layout. In various embodiments, the first position is received based on the location of a cursor when the user enters a route tracing mode in the design layout and can correspond to a pin on a chip or other circuit element in the design layout or define a portion of a trunk trace that is initially unconnected to another circuit element in the design layout.

At block 320, the trace function routes a trace to a second position in the design layout by following a path that a cursor takes in the design layout. The trace function continues to create the trace per the path followed by the cursor (e.g., per FTC routing mode) until an exit command/condition is received or a command to enter P2P routing mode is received. In some embodiments, trace function routes the trace over a path set by following the cursor that traverses at least two layers in the design layout.

At block 330, the trace function receives a command to enter P2P routing mode. In various embodiments, the command to enter P2P routing mode allows the cursor to remain within the active window of the design layout and stationary. Stated differently, the second position is where cursor is located when the command to enter P2P routing mode is received and signals a single position where both the FTC mode ends and P2P mode begins, thus allowing the cursor to be located exactly at that position. Accordingly, the user does not have to readjust the position of the cursor when switching modes, but can seamlessly transition back and forth between a first mode of routing and a second mode of routing.

At block 340, in response to receiving a first command to switch from the first routing mode to a second routing mode, the trace function follows the cursor from the second position to a third position in the design layout. In various embodiments, following the cursor from the second position to a third position includes displaying a fly-line from the second position to a current location of the cursor over any intervening objects in the design layout between the second position and the current location of the cursor. The trace function does not generate a trace until a command to exit P2P routing mode and return to FTC mode is received at block 350.

At block 360, in response to receiving a second command to switch from the second routing mode to the first routing mode, the trace function stops following the cursor with a fly-line or other indicator from the second position and automatically links the trace from the second position to the third position. In some embodiments, linking the trace between the second position and the third position includes automatically traversing at least two layers in the design layout (e.g., to route around obstacles in three dimensions). The third position is where cursor is located when the command to exit P2P routing mode is received and signals a single position where both the P2P mode ends and FTC mode begins, thus allowing the cursor to be located exactly at that position. Accordingly, the user does not have to readjust the position of the cursor when switching modes, but can seamlessly transition back and forth between a first mode of routing and a second mode of routing.

At block 370, the trace function routes a trace to a fourth position in the design layout by following a path that a cursor takes in the design layout starting from the third position. The trace function continues to create the trace per the path followed by the cursor (e.g., per FTC routing mode) until an exit command/condition is received or a subsequent command to enter P2P routing mode is received.

Figure 4:
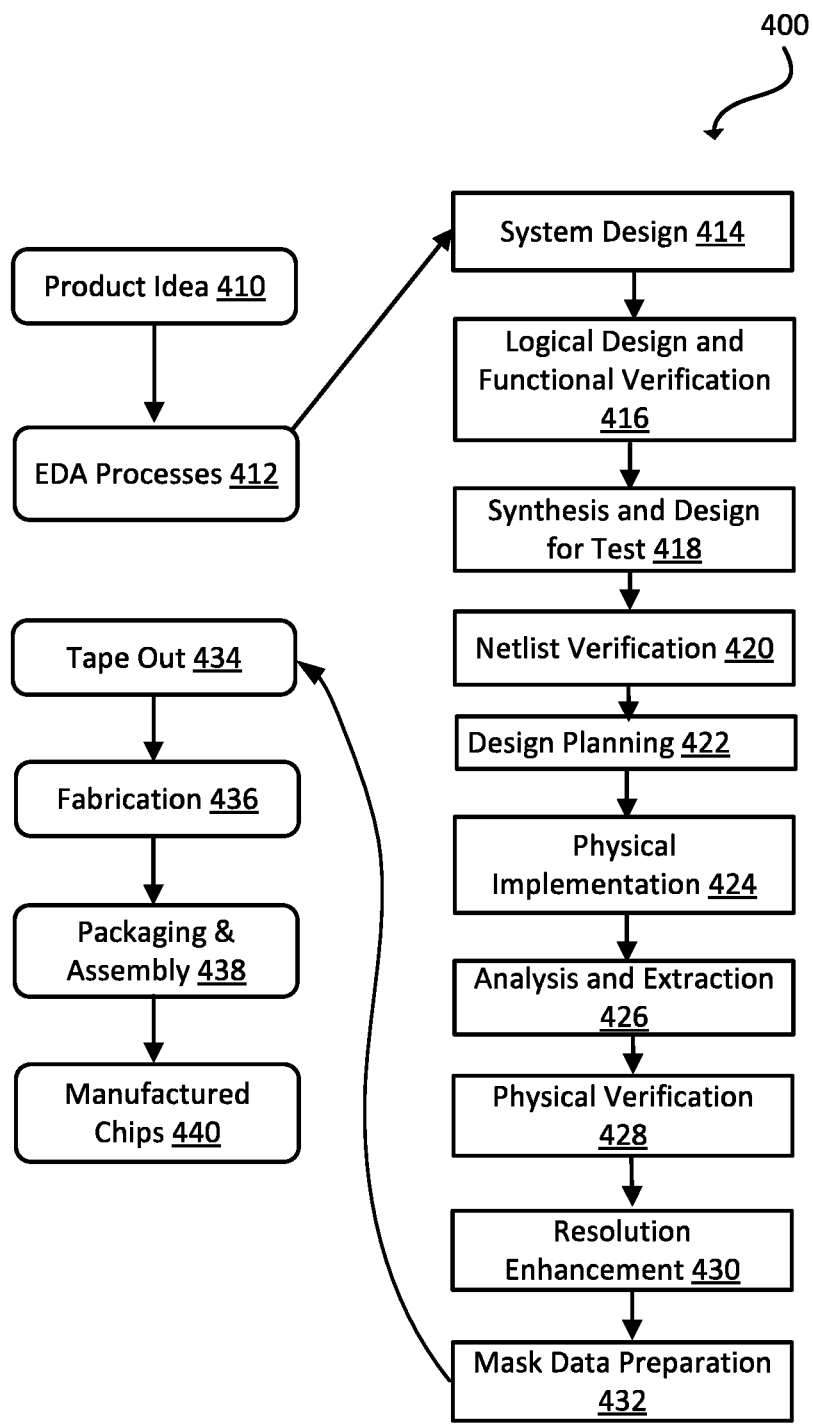
FIG. 4 illustrates an example set of processes used during the design, verification, and fabrication of an article of manufacture such as an integrated circuit in accordance with some embodiments of the present disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 410 with information supplied by a designer, information which is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly processes 438 are performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 4. The processes described by be enabled by EDA products (or tools).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 510 of FIG. 5) may be used to store the programs and data structures that are used by some or all of the EDA products described herein, and products used for development of cells for the library and for physical and logical design that use the library.

Figure 5:
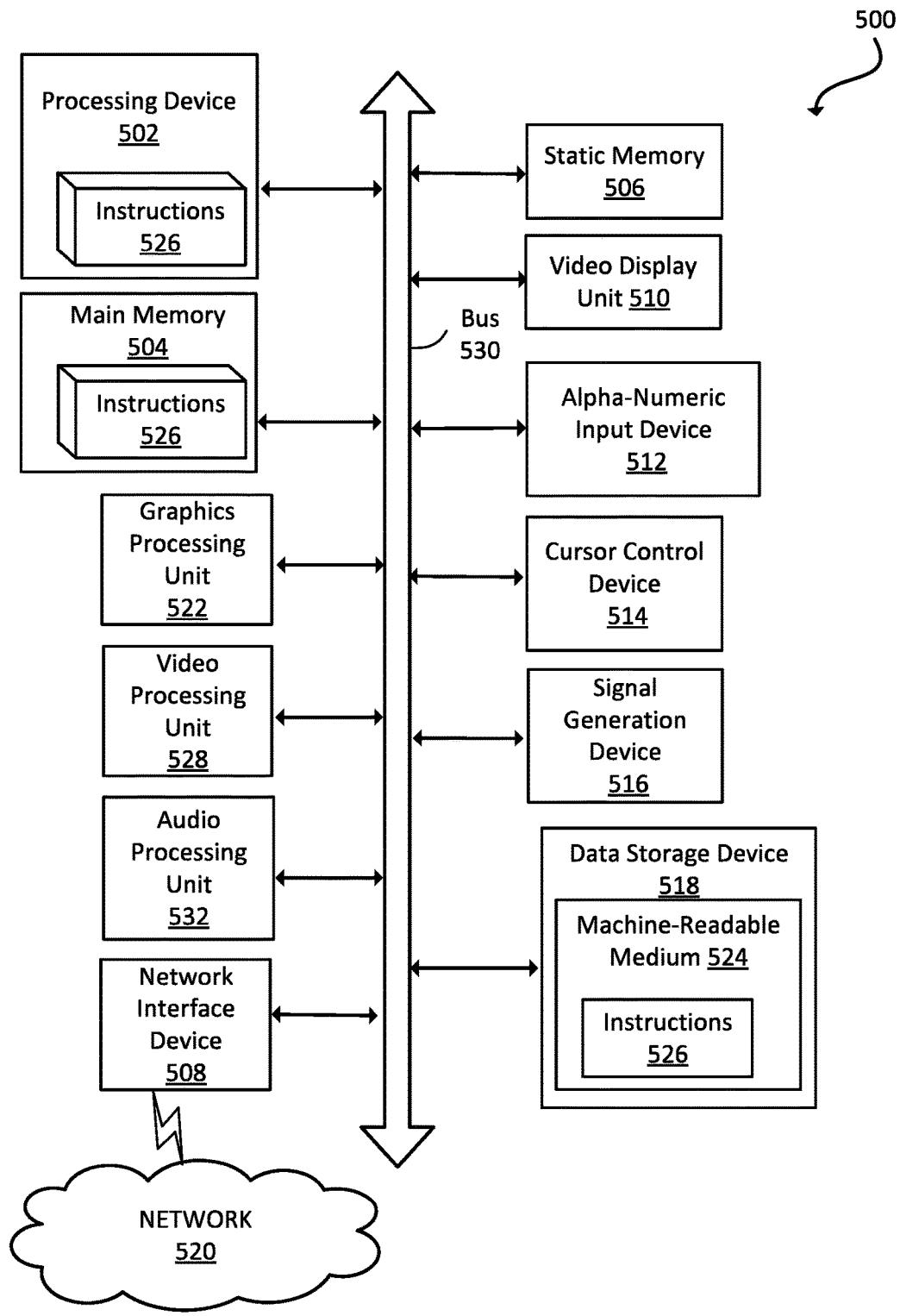
FIG. 5 illustrates an example machine of a computer system within which a set of instructions, for causing the machine to perform any one or more of the methodologies discussed herein, may be executed, according to embodiments of the present disclosure.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
    in response to receiving a selection of a first position in a design layout comprising circuit elements, routing a trace in the design layout in a first routing mode from the first position to a second position by following a cursor over a first user-defined path, wherein the trace between the first position and the second position matches a first path traversed by the cursor over a first period of time;
    switching from the first routing mode to a second routing mode while the cursor remains at the second position;
    following a second user-defined path defined by the cursor from the second position to a third position in the design layout;
    switching from the second routing mode to the first routing mode while the cursor remains at the third position;
    in response to switching from the second routing mode to the first routing mode, linking the trace from the second position to the third position based on locations of the circuit elements disposed between the second position and the third position; and
    routing, by a processing device, the trace in the design layout in the first routing mode from the third position to a fourth position by following the cursor over a third user-defined path, wherein the trace between the third position and the fourth position matches a second path traversed by the cursor over a second period of time.

2. The method of claim 1, wherein following the second user-defined path from the second position to the third position includes displaying a fly-line from the second position to a current location of the cursor over any intervening circuit elements in the design layout between the second position and the current location of the cursor.

3. The method of claim 1, wherein the first user-defined path over which the trace is routed in the first routing mode traverses at least two layers in the design layout.

4. The method of claim 1, wherein linking the trace between the second position and the third position in the second routing mode includes traversing at least two layers in the design layout.

5. The method of claim 1, wherein the first position defines a portion of a trunk trace that is initially unconnected to another circuit element in the design layout.

6. The method of claim 1, wherein switching from the first routing mode to the second routing mode is performed in response to receiving a first indication that the second position is a jump start position and wherein switching from the second routing mode to the first routing mode is performed in response to receiving a second indication that the third position is a jump end position.

7. The method of claim 1, wherein the first position is a free space in the design layout not associated with an existing circuit element in the design layout.

8. A system, comprising:
    a processor; and
    a memory including instructions that when executed by the processor, cause the processor to perform operations to:
        providing a cursor in association with a design layout;
        in response to receiving a follow-the-cursor (FTC) command at a first position in the design layout, create a first trace in the design layout where the cursor is displayed along a first path traversed by the cursor over a first period of time after receiving the FTC command;
        in response to receiving a start command for point-to-point routing at a second position in the design layout:
            complete the first trace at the second position; and
            provide an indicator at the second position;
        in response to receiving an end command for point-to-point routing at a third position in the design layout:
            create a second trace in the design layout where the cursor is displayed along a second path traversed by the cursor over a second period of time after receiving the end command; and
            create a third trace in the design layout, wherein the third trace is routed from the first trace to the second trace.

9. The system of claim 8, wherein the indicator is a fly-line based at the second position and linked to a current position of the cursor in the design layout.

10. The system of claim 9, wherein the processor is further enabled to:
    model a pre-existing circuit element in the design layout, wherein the second position is located on a first side of the pre-existing circuit element and the third position is located on a second side of the pre-existing circuit element opposite to the first side, and wherein the fly-line is displayed over the pre-existing circuit element.

11. The system of claim 10, wherein routing the third trace creates the third trace to route around a third side of the pre-existing circuit element located between the first side and the second side in a single layer of the design layout.

12. The system of claim 8, wherein the start command is received with the cursor stationary at the second position and the end command is received with the cursor stationary at the third position.

13. The system of claim 8, wherein the cursor follows touch-screen input.

14. The system of claim 8, wherein in response to receiving the end command for point-to-point routing at the third position in the design layout, the operation further comprises:
   generating a first candidate trace and a second candidate trace between the second position and the third position, wherein the first candidate trace follows a different path between the second position and the third position than the second candidate trace; and
   in response to receiving user selection of the first candidate trace, selecting the first candidate trace to define the second trace.

15. A non-transitory computer readable storage medium including instructions that are executable by a processor to perform operations comprising:
   creating a trace in a design layout by following a location of a cursor relative to the design layout, wherein the trace matches a path traversed by the cursor over a period of time;
   while creating the trace by following the location of the cursor, receiving a start command for routing the trace in a point-to-point mode when the cursor is located at a first position in the design layout;
   following the cursor to a second position in the design layout without extending the trace from the first position;
   receiving an end command for routing the trace in the point-to-point mode when the cursor is located at the second position; and
   linking the trace from the first position to the second position around any pre-existing circuit elements in the design layout.

16. The non-transitory computer readable storage medium of claim 15, wherein the operations further comprise:
   creating the trace from the second position to a third position based on a path taken by the cursor relative to the design layout.

17. The non-transitory computer readable storage medium of claim 15, wherein following the cursor includes displaying a fly-line from the first position to a current location of the cursor relative to the design layout that overlays any of the pre-existing circuit elements located between the first position and the current location.

18. The non-transitory computer readable storage medium of claim 15, wherein linking the trace from the first position to the second position causes the trace to traverse at least two layers in the design layout.

19. The non-transitory computer readable storage medium of claim 15, wherein linking the trace from the first position to the second position generates the trace in a single layer of the design layout and shifts at least one of the pre-existing circuit elements to a different layer of the design layout.

20. The non-transitory computer readable storage medium of claim 15, wherein the path traversed by the cursor that the trace matches includes a segment that is not an orthogonal line to another segment.

* * * * *

UNITED STATES PATENT AND TRADEMARK OFFICE
CERTIFICATE OF CORRECTION

| | |
|---|---|
| PATENT NO. | : 11,100,271 B2 |
| APPLICATION NO. | : 17/026114 |
| DATED | : August 24, 2021 |
| INVENTOR(S) | : Mysore Sriram, Praveen Yadav and Philippe Aubert McComber |

It is certified that error appears in the above-identified patent and that said Letters Patent is hereby corrected as shown below:

On the Title Page

Item (72), delete "Praveeen YADAV", and insert -- Praveen YADAV --, therefor.

Signed and Sealed this
Thirtieth Day of August, 2022

Katherine Kelly Vidal
*Director of the United States Patent and Trademark Office*